United States Patent [19]
Sehmbey et al.

[11] Patent Number: 5,937,937
[45] Date of Patent: Aug. 17, 1999

[54] HEAT SINK AND METHOD FOR REMOVING HEAT FROM A PLURALITY OF COMPONENTS

[75] Inventors: Maninder Sehmbey, Wheeling; Kurt Arthur Estes, Lake Zurich; Kevin James McDunn, Lake in the Hills, all of Ill.

[73] Assignee: Motorola, Inc., Schaumburg, Ill.

[21] Appl. No.: 09/099,313

[22] Filed: Jun. 18, 1998

[51] Int. Cl.$^6$ .................................................... F28D 15/00
[52] U.S. Cl. .............................. 165/104.33; 165/104.14; 165/135; 361/700; 257/715
[58] Field of Search ..................... 165/104.14, 104.21, 165/104.33, 135, 46, 272; 361/700; 257/715; 174/152

[56] References Cited

U.S. PATENT DOCUMENTS

| | | | |
|---|---|---|---|
| 3,579,821 | 5/1971 | Kurisu | 361/700 X |
| 4,133,376 | 1/1979 | Eilenberg et al. | 165/135 X |
| 4,137,964 | 2/1979 | Buckley | 165/272 X |
| 4,941,530 | 7/1990 | Crowe | 165/104.33 |
| 5,161,609 | 11/1992 | Dutertre et al. | 165/272 X |

FOREIGN PATENT DOCUMENTS

| | | | |
|---|---|---|---|
| 1284506 | 12/1968 | Germany | 165/104.33 |
| 3208972 | 12/1983 | Germany | 165/135 |
| 220090 | 9/1988 | Japan | 165/104.14 |

*Primary Examiner*—Christopher Atkinson
*Attorney, Agent, or Firm*—Heather L. Creps

[57] ABSTRACT

The heat sink has an interior and has a first exterior surface and a second exterior surface, and includes a first heat removal region disposed in the interior. The first heat removal region defines a first cavity and is at least partially filled with a liquid. The first heat removal region transfers a first amount of heat from a first electronic device via a pool boiling phenomenon when the first electronic device is disposed on the first exterior surface. A first conduction-inhibiting region is disposed proximate the first cavity. A second heat removal region is disposed in the interior. The second heat removal region defines a second cavity and is at least partially filled with the liquid. The second heat removal region transfers a second amount of heat from a second electronic device via the pool boiling phenomenon when the second electronic device is disposed on the first exterior surface.

13 Claims, 1 Drawing Sheet

HEAT SINK AND METHOD FOR REMOVING HEAT FROM A PLURALITY OF COMPONENTS

FIELD OF THE INVENTION

This invention relates generally to cooling for electronic devices, and, more particularly, to a heat sink and a method removing heat from a plurality of components.

BACKGROUND OF THE INVENTION

Electronic devices such as linear power amplifiers, multi-chip modules, electronic hybrid assemblies such as power amplifiers, microprocessors and passive components such as filters may contain heat sources which require cooling during normal operation.

Various techniques may be used for cooling electronic devices. Traditionally, electronic devices have been cooled by natural or forced air convection which involves moving air past heat sinks attached directly or indirectly to the devices.

Efforts to reduce the size of devices have focused upon increased integration of electronic components. Sophisticated thermal management techniques using liquids, which allow further abatement of device sizes, have often been employed to dissipate the heat generated by integrated electronics.

The cold plate is typically a direct replacement for an air-cooled heat sink in which water or another fluid flows through internal passages where the heat sink was originally mounted. This single-phase technique cools the whole surface of an electronic device, rather than primary heat sources, such as individual electronic components, located on the surface of the device. Cooling an entire electronic device may not be desirable or practical for several reasons. First, product designs may result in electronic components having various maximum operating temperatures being co-located—thus reducing the life of some electronic devices which are forced to function at higher than desired temperatures or reducing overall heat transfer efficiency when other electronic components are cooled below their reliable maximum operating temperatures. Second, cold plates' flow passages are generally highly complex, which makes it difficult to accurately predict heat transfer characteristics. Third, high fluid flow rates (up to several gallons per minute) may be required for successful application of cold plate technology.

Although two-phase cooling techniques such as evaporative spray cooling and heat pipes are preferred methods of heat removal in many electronics applications, heat sinks utilizing two-phase cooling techniques suffer from many of the same disadvantages as cold plates, typically having complex designs and providing for only one operating temperature for an entire heat sink.

There is therefore a need for a hybrid apparatus and method for cooling an electronic device which uses a two-phase cooling technique and also a conduction/convection technique, and which allows for localized cooling of devices or components having different optimal operating temperatures.

SUMMARY OF THE INVENTION

According to an aspect of the present invention, the foregoing needs are addressed by a heat sink which has an interior and has a first exterior surface and a second exterior surface, and includes a first heat removal region disposed in the interior. The first heat removal region defines a first cavity and is at least partially filled with a liquid. The first heat removal region transfers a first amount of heat from a first electronic device via a pool boiling phenomenon when the first electronic device is disposed on the first exterior surface. A first conduction-inhibiting region is disposed proximate the first cavity. A second heat removal region is disposed in the interior. The second heat removal region defines a second cavity and is at least partially filled with the liquid. The second heat removal region transfers a second amount of heat from a second electronic device via the pool boiling phenomenon when the second electronic device is disposed on the first exterior surface.

According to another aspect of the present invention, a method for removing heat from a plurality of components includes disposing a first component of the plurality of components proximate a first heat removal region; the first heat removal region transferring a first amount of heat from the first component via a pool boiling phenomenon; disposing a second component of the plurality of components proximate a second heat removal region; and the second heat removal region, thermally isolated from the first heat removal region, the second heat removal region transferring a second amount of heat from the second component via the pool boiling phenomenon.

DETAILED DESCRIPTION OF THE PREFERRED EMBODIMENTS

Figure 1:
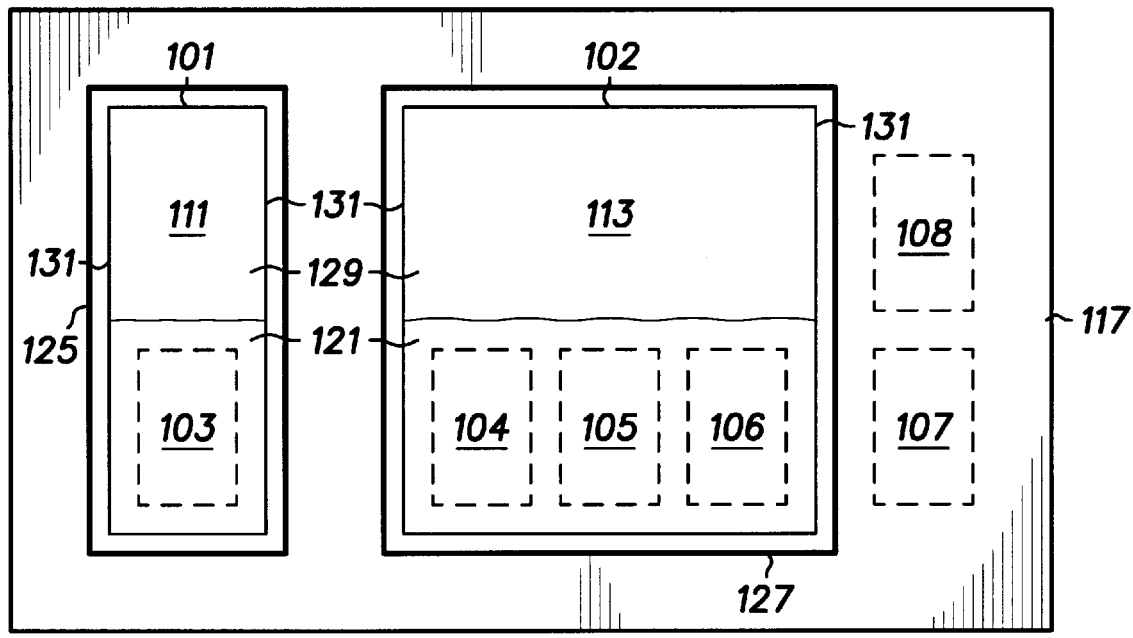
FIG. 1 is a front view of a heat sink for removing heat from one or more electronic devices according to a preferred embodiment of the present invention.
Figure 2:
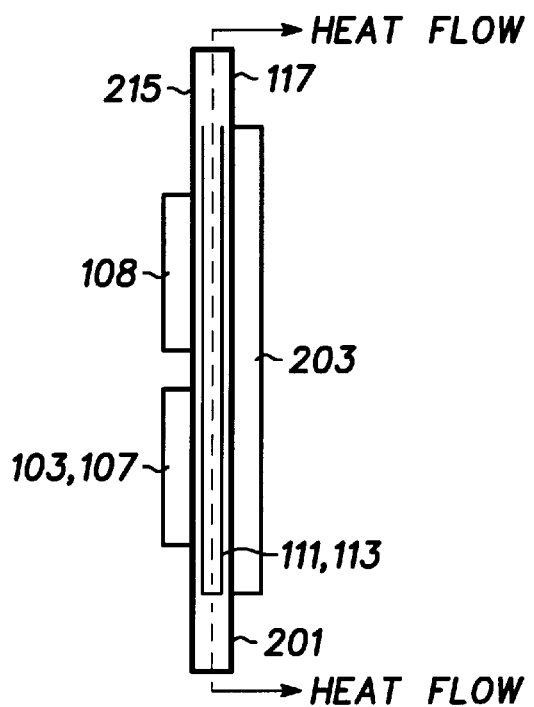
FIG. 2 is an edge view of the heat sink shown in FIG. 1.

Turning now to the drawings, wherein like numerals designate like components, FIG. 1 is a front view of a heat sink 100 for removing heat from one or more electronic devices 103–108 according to a preferred embodiment of the present invention. FIG. 2 is an edge view of heat sink 100.

Heat sink 100 has a first exterior surface 215, upon which electronic devices 103–108 may be disposed, and includes a second exterior surface 117. A plurality of fins 203 may be disposed on second surface 117. Fins 203 may be made of aluminum, copper, brass, zinc or magnesium or another suitable material and may be attached to second surface 117 via brazing, bonding, swaging, clamping or any other suitable method.

As shown, a first heat removal region 101 is disposed within interior 201 of heat sink 100. The first heat removal region 101 defines a first cavity 111 which is at least partially filled with a fluid 121. Fluid 121 may be a dielectric fluid such as Fluorinert™ perfluorocarbon fluid or another fluid such as water, hydrogenated fluorocarbons, hydrogenated fluoroethers, alcohols, ammonia, ethylene glycol, acetone, or a mixture of any of these.

A second heat removal region 102 is also disposed within interior 201. The second heat removal region 102 defines a second cavity 113 which is preferably at least partially filled with fluid 121. It is contemplated that first and second heat removal regions 101, 102 may contain dissimilar types of fluids or combinations of fluids.

Heat sink 100 may be made of aluminum or another material such as copper, brass, zinc, magnesium, stainless steel, ceramics, or metalized plastic, such materials being well-known and widely available. Heat sink 100 may be formed by a variety of commonly used methods like casting, machining, forming, brazing, welding. Heat removal regions 101, 102 may be formed in any desired configuration, and each may have a cross-sectional shape which rectangular or another suitable shape and each may be the same or a different size. Fluid 121 may be introduced to heat removal regions 101, 102 by any suitable method. For example, a fill tube attached (e.g., welded) to each individual cavity may be used to fill the fluid. The charging process may be completed by evacuating the cavity via the fill tube and then filling it with the liquid. Then, the fill tube may be welded shut after the charging process.

A first conduction-inhibiting region 125 is disposed proximate first cavity 111 and a second conduction-inhibiting region 127 is disposed proximate second cavity 113. Conduction-inhibiting regions 125, 127 may be grooves located on first exterior surface 215, or may be located wholly within interior 201. In addition, the grooves may be filled with insulative epoxy to provide structural strength and allow for deep grooves.

During operation of heat sink 100 in accordance with the preferred embodiment of the present invention, a first component 103 is disposed proximate first heat removal region 101, and a second component part 104 is disposed proximate second heat removal region 102. Of course, more than one component may be disposed proximate regions 101, 102. Other components 107, 108 may be located external to heat removal regions 101, 102.

In addition to liquid 121, first and second heat removal regions 101, 102 preferably include evaporator regions 129, and condenser regions 131. Components 103, 104 may be located anywhere on first exterior surface 215, depending upon an amount of heat which is required to be dissipated from components 103, 104. For example, heat transfer may be increased when components 103, 104 are approximately aligned with evaporator regions 129.

First and second heat removal regions 101, 102 are configured to transfer different amounts of heat from components 103, 104. Thus, component 104 may operate at a lower temperature than component 103, or vice-versa, depending on the design of the condenser region and the external heat rejection fins. For example, if lower temperature is needed, more heat rejection fins may be placed external to the condenser region.

As heat is transferred from components 103, 104, pool boiling occurs in a sealed thermodynamic system, relying on internal evaporation and condensation cycles. That is, liquid 121 boils and absorbs heat energy dissipated from components 103, 104 in evaporator regions 129. Vapors produced from the boiling process enter condenser regions 131 (the internal walls of cavities 111, 113), and are condensed by rejecting heat energy to the ambient via external fins 203. Gravity aids in returning the condensed liquid to the liquid 121 partially filling cavities 111, 113.

Conduction-inhibiting regions 125,127 serve to substantially thermally isolate components 103–106, so that heat dissipated by heat removal regions 101, 102, respectively, will not be transferred to any region exterior to conduction-inhibiting regions 125, 127, respectively. Regions 101, 102, 125 and 127 substantially direct heat flow to fins 203.

Components 107, 108, which are not proximate heat removal regions 101, 102, may be cooled by natural or forced air convection or conduction. In addition, heat removal from components 107, 108 may be augmented by including a thermally-conductive medium in interior 201, such as a porous medium (e.g., aluminum or ceramic foam), or another suitable medium.

An electronic device or a group of electronic devices having dissimilar operating temperatures or heat loads may be effectively cooled using the disclosed apparatuses and methods. Use of one or more heat removal regions which transfer different amounts of heat from electronic devices via pool boiling phenomena allows maximum heat transfer and minimum heat sink sizes to achieved.

In addition, operating individual electronic components at various temperatures according to size, type, etc., helps to increase reliability of the components through reduction of thermal variation and associated thermal stresses. Also, various fluid coolants may be used, for example, water, which has very low toxicity and few handling problems.

It should be appreciated that the present invention is not limited to cooling an electronic component, but may be adapted to cool any heat source, for example, another heat sink or flange which is mounted to a substrate in a traditional fashion. It will also be understood that references to electronic devices 103–108 apply, without limitation, to all types of electronic components, modules and products.

It will be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. A heat sink having an interior and having a first exterior surface and a second exterior surface, comprising:

a first heat removal region disposed in the interior, the first heat removal region defining a first cavity and being at least partially filled with a liquid, the first heat removal region transferring a first amount of heat from a first electronic device via a pool boiling phenomenon when the first electronic device is disposed on the first exterior surface;

a first conduction-inhibiting region disposed on the first exterior surface, proximate the first cavity; and a second heat removal region disposed in the interior, the second heat removal region defining a second cavity and being at least partially filled with the liquid, the second heat removal region transferring a second amount of heat from a second electronic device when the second electronic device is disposed on the first exterior surface.

2. The heat sink according to claim 1, the first heat removal region having a first liquid region, a first evaporator region and a first condenser region, wherein when the first electronic device is disposed on the first exterior surface, the first electronic device is positioned proximate the first evaporator region.

3. The heat sink according to claim 1, the second heat removal region having a second liquid region, a second evaporator region and a second condenser region, wherein when the second electronic device is disposed on the first exterior surface, the second electronic device is positioned proximate the second evaporator region.

4. The heat sink according to claim 1, wherein the first amount of heat is less than the second amount of heat.

5. The heat sink according to claim 1, wherein the first heat removal region and the second heat removal region are different sizes.

6. The heat sink according to claim 1, wherein the first conduction-inhibiting region inhibits heat transfer from the first heat removal region to the second heat removal region.

7. The heat sink according to claim 1, wherein the first and second heat removal regions are separated a predetermined distance from each other.

8. The heat sink according to claim 1, further comprising:

a plurality of fins disposed on the second exterior surface, the first and second amounts of heat being transferred to at least some of the plurality of fins.

9. The heat sink according to claim 8, wherein when a third electronic device is disposed on the first exterior surface, a third amount of heat is transferred via conduction from the third electronic device to at least some of the plurality of fins.

10. The heat sink according to claim 1, wherein the first conduction-inhibiting region surrounds the first cavity.

11. The heat sink according to claim 1, further comprising:

a second conduction-inhibiting region surrounding the second heat removal region.

12. The heat sink according to claim 1, wherein the second heat removal region transfers the second amount of heat via the pool boiling phenomenon.

13. The heat sink according to claim 1, wherein the second heat removal region transfers the second amount of heat via a conduction process.

* * * * *